United States Patent [19]

Mazzucco et al.

[11] Patent Number: 4,839,610

[45] Date of Patent: Jun. 13, 1989

[54] SYSTEM FOR AUTOMATICALLY CONTROLLING THE GAIN-BANDWIDTH PRODUCT OF OPERATIONAL AMPLIFIERS

[75] Inventors: Michelangelo Mazzucco, Santa Maria Tempio; Vanni Poletto, Camino; Mario Sartori, Turin, all of Italy

[73] Assignee: Cselt-Centro Studi E Laboratori Telecomunicazioni S.p.A., Turin, Italy

[21] Appl. No.: 119,190

[22] Filed: Nov. 10, 1987

[30] Foreign Application Priority Data

Dec. 23, 1986 [IT] Italy ................. 67965 A/86

[51] Int. Cl.[4] .............................................. H03G 3/20
[52] U.S. Cl. .................................... 330/278; 330/129
[58] Field of Search ................ 330/129, 136, 282, 278

[56] References Cited

U.S. PATENT DOCUMENTS 4,166,981 9/1979 Marchasson et al. .............. 330/282

Primary Examiner—Gene Wan
Attorney, Agent, or Firm—Herbert Dubno

[57] ABSTRACT

A system for automatically controlling the gain-bandwidth product of operational amplifiers, wherein a gain-bandwidth product (G*B) of one of the amplifiers placed on the same chip as the amplifiers to be controlled is measured and the resulting signal is used to control through a bias circuit, the gain-bandwidth products of all the amplifiers, the value of these products being presettable by the frequeny of a control signal sent to the system input. The reference amplifier is highly compensated in the configuration of voltage follower.

2 Claims, 2 Drawing Sheets

SYSTEM FOR AUTOMATICALLY CONTROLLING THE GAIN-BANDWIDTH PRODUCT OF OPERATIONAL AMPLIFIERS

FIELD OF THE INVENTION

The present invention relates to electronic circuits implemented as integrated circuits and, more particularly, to a system for automatically controlling the gain-bandwidth product of operational amplifiers.

BACKGROUND OF THE INVENTION

As known, integrated circuits comprising on a single silicon chip a plurality of operational amplifiers, which sometimes are internally connected to RC networks so as to implement integrator circuits, are commercially available. These circuits can be advantageously used in the design of integrated filters, since the number of external components required is very limited. More particularly, capacitors and external inductors can be avoided by the use of suitable techniques, e.g. of "Active R" type.

However, there are a number of disadvantages in the industrial use of such types of filters. A first disadvantage is due to the limited accuracy of the individual integrated elements, namely, transistors, resistors, capacitors, owing to unavoidable fabrication tolerances. As a consequence, the gain-bandwidth (G*B) product of the amplifiers or of the integrators of an integrated circuit is generally different from that of another integrated circuit. Since the filter cut-off frequency depends on that product, filters different from the computed ones can be obtained. Hence it was necessary to provide at least a tuning element outside the integrated circuit, upon which a skilled technician could act during an initial adjusting phase. Yet this kind of operation is costly and requires a more complicated integrated circuit, since suitable pins, connected to internal test points should be provided, although these pins will be no longer used after tuning. This problem will become even more serious if the filter belongs to a rather complex system, e.g. a modem.

Another disadvantage is due to gain-bandwidth product variations dependent on temperature variations, affecting bias current ratios, integrated capacities, transistor parameters, et cetera. Of course this disadvantage cannot be avoided by only occasional adjustments; but rather an automatic control system is required.

The desired filter should require neither initial tunings, whatever the integrated circuit employed, nor adjustments during the operation, owing to thermal drift. Its cut-off frequency ought to be certainly determined a priori and should not depend on the integrated-circuit characteristics.

Some systems for automatically controlling the gain-bandwidth product are already known in the literature. More particularly two systems of this kind are described in the article entitled "Continuous-Time MOSFET-C Filters in VLSI" by Yannis Tsividis et alii, IEEE Journal of solid-state circuits, Vol. SC-21, No. 1, February 1986, pages 15–29 and shown in FIGS. 1(b) and 1(c).

These are indirect methods, i.e. methods in which the control of gain-bandwidth product is carried out on one or more amplifiers on the same silicon chip, carrying the amplifiers actually used to implement the filter. Undergoing the same phases of the technological process, fabrication tolerances are the same, and being in close proximity on the chip, temperature variations are common to all the amplifiers. One or more amplifiers can then be used to measure G*B and to extract a signal proportional to it, which controls G*B of all the amplifiers present in the same integrated circuit. More particularly this error signal can be used to control bias currents upon which the amplifier G*Bs can depend.

These methods are also called "indirect tuning" methods, since, by controlling G*Bs, filter cut-off frequencies are controlled; these filters hence become tunable at the desired frequencies on the basis of a previous programmation.

According to the method of the system shown in FIG. 1(b) of the cited article, at least two operational amplifiers are used to implement a reference filter of the "biquad" type, to whose input a predetermined-frequency clock signal is sent. Said signal is also sent to a comparison circuit, which compares its phase with the phase of the same signal extracted at the filter output. An error signal is obtained from the comparison, which acts on the filter amplifiers to keep the phase difference at the chosen frequency at a predetermined and constant value, thereby compensating for fabrication tolerances and temperature variations. This method requires at the input a sinusoidal signal, which generally presents some difficulties in an environment in which digital signals are found and occupies at least two amplifiers and other elements for implementing the reference filter. Besides the method demands a four-quadrant analog multiplier for implementing the comparison circuit. As is known, the design of this multiplier presents considerable difficulties due to circuit complexity, since non-linearity introduced by transistors should be avoided.

The relation between the G*B product and the signal frequency at the reference-filter input is also rather difficult to compute.

According to the method of the system shown in FIG. 1(c), at least two amplifiers are interconnected to obtain a voltage-controlled oscillator. The signal produced is compared in a phase-comparator with a reference signal coming from the outside and the error signal, duly filtered, is used to stabilize the integrated-oscillator frequency. Thus a well-known "phase-locked loop", or PLL, is formed. Since the fabrication tolerances of the integrated circuit which comprises the amplifiers and temperature variations determine corresponding variations in the frequency of the signal generated by the voltage-controlled oscillator, its correction based on the frequency of the external signal causes the correction of the G*B products of all the amplifiers. This system unfortunately requires a further filter to limit residual ripple of error signal, and hence a further external capacitor. In fact it is not advisable to obtain this operation from the loop-filter alone, implementing it with very-low cut-off frequency, as locking difficulties could arise. The whole system ought to be designed as well as possible so as to always ensure integrated oscillator locking to the reference phase, otherwise G*B product control might be lost. This system also requires a circuit for the control of the signal level at the output of the voltage-controlled oscillator, in order to prevent it from being blocked at one of the power-supply voltage levels (+Vcc, −Vcc) owing to input voltage drift.

SUMMARY OF THE INVENTION

The disadvantages above are overcome by the system for automatically controlling the gain-bandwidth product of operational amplifiers, provided by the invention, which allows the indirect control of G*B product through the frequency of a square-wave signal sent to the input, requires the use of only a single external capacitor and a single operational amplifier to measure the G*B product and whose circuitry is easy to implement, e.g. as an integrated circuit.

The present invention provides a system for automatically controlling the gain-bandwidth product of operation amplifiers, wherein gain-bandwidth product of one of the amplifiers placed on the same chip as the amplifiers to be controlled is measured and the resulting signal is used to control through a bias circuit the gain-bandwidth products of all the amplifiers, the value of these products being presettable by the frequency of a input. According to the invention, the circuit comprises:

a logic circuit, which receives at the input of the logic circuit to control signal with predetermined frequency and a duty-cycle equal to 50 percent and supplies at a first output a signal with a frequency equal to half the input signal frequency and at a second output a signal obtained from the logic AND between the input signal and the signal at the first output;

a squaring circuit, which receives at the input the signal present at the first output of said logic circuit and supplies at the output a corresponding square-wave signal with positive or negative amplitudes equal to that of a reference voltage;

a source of that reference voltage;

one of said operational amplifiers, highly compensated for so as to present at very low frequency the first pole of the transfer function (i.e. the ratio between output and input voltages of the negative feedback operational amplifier) and placed in the voltage-follower configuration, which amplifier receives at the non-inverting input the signal supplied at the output by said squaring circuit;

a threshold comparator which receives at the inverting input the signal supplied by said operational amplifier and at the non-inverting input both the signal supplied by said squaring circuit and said reference voltage through a first and a second resistor and supplies at the output a signal with leading edges coincident with those of the non-inverting input signal and trailing edges coincident with the instants at which voltages at the inputs are equal;

a duration comparing circuit, which carries out an EX-OR operation on the signals supplied by said threshold comparator and by said logic circuit at the second output, supplying at the output a current signal with outgoing direction when the high-level part of the signal supplied by the threshold comparator has a shorter duration than that of the signal supplied by the logic circuit and with incoming direction in the opposite case; and a capacitor, with a terminal connected to the negative voltage source and the other terminal connected to the output of the duration comparing circuit and to the input of said bias circuit, which controls amplifier Gain-Bandwidth product in a way inversely proportional to the voltage across the capacitor terminals.

BRIEF DESCRIPTION OF THE DRAWING

The foregoing and other characteristics of the present invention will be made clearer by the following description of a preferred embodiment thereof, given by way of non-limiting example, and with reference to the annexed drawing in which.

SPECIFIC DESCRIPTION

The system described hereinbelow carries out the measurement of gain-bandwidth product by using one of the operational amplifiers higly compensated for, so as to present at very low frequency the first pole of the transfer function. This can be obtained by the use of a low value capacitor, which can be already integrated. As known such an amplifier acts as a low-pass RC network, with a cut-off frequency dependent on G*B product, when connected as voltage follower. More particularly, its transfer function is given by $G^*B/(s+G^*B)$, where s is the complex variable, and the G*B product represents the inverse of the time constant.

By measuring the modifications made by such a circuit to a square-wave signal sent to its input, a G*B product value can be derived and possibly corrected so as to bring it again to the predetermined value.

Figure 1:
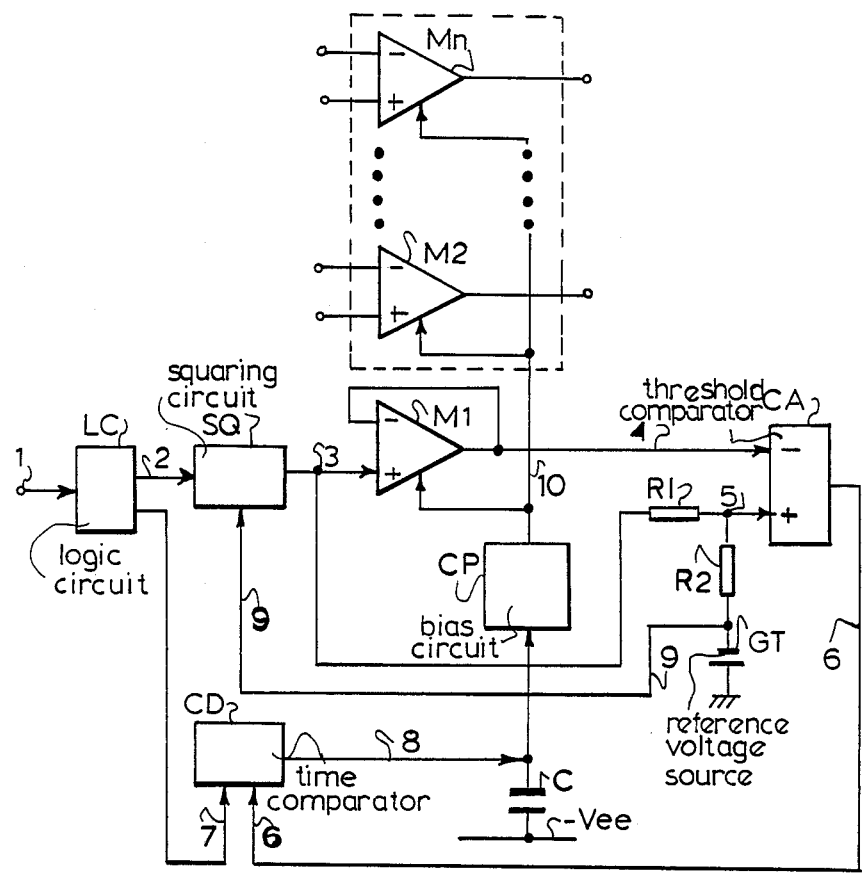
FIG. 1 is a block-diagram of the sysem provided by the invention.

The square-wave control signal arrives at the wire denoted by reference 1 on FIG. 1, connected to the input of a logic circuit LC. This signal presents a duty-cycle equal to 50 percent and a frequency fc of convenient value to the G*B product desired. More particularly, in the domain of linearity of the various system blocks and by a suitable choice of some elements, the relation becomes particulary simple: $G^*B=fc/\pi$.

Circuit LC supplies at its first output 2 a square-wave signal with frequency equal to half the frequency of the signal on wire 1 and at its first output 7 a square-wave signal obtained from the logic AND between the signal on wire 1 and that on wire 2. Said signals are shown in the timing diagram of FIG. 2 and denoted by references V1, V2, V7. Of course the digit part of the reference coincides with the wire number upon which the shown signal is present.

The signal on wire 2 of FIG. 1 is sent to a squaring circuit SQ, which receives also on wire 9 a dc reference voltage Ao generated by a suitable source GT. At the output on wire 3 there is a signal equal to the one present on wire 2, but with positive and negative levels equal to Ao and $-Ao$ respectively. Said signal is sent to the non-inverting input of one of the operational amplifiers M1, in a voltage-follower configuration. The other amplifiers M2, ..., Mn can be used to carry out the desired functions, for example for filtering functions, their G*B products undergoing an indirect control in response to the frequency of the signal on wire 1.

Figure 2:
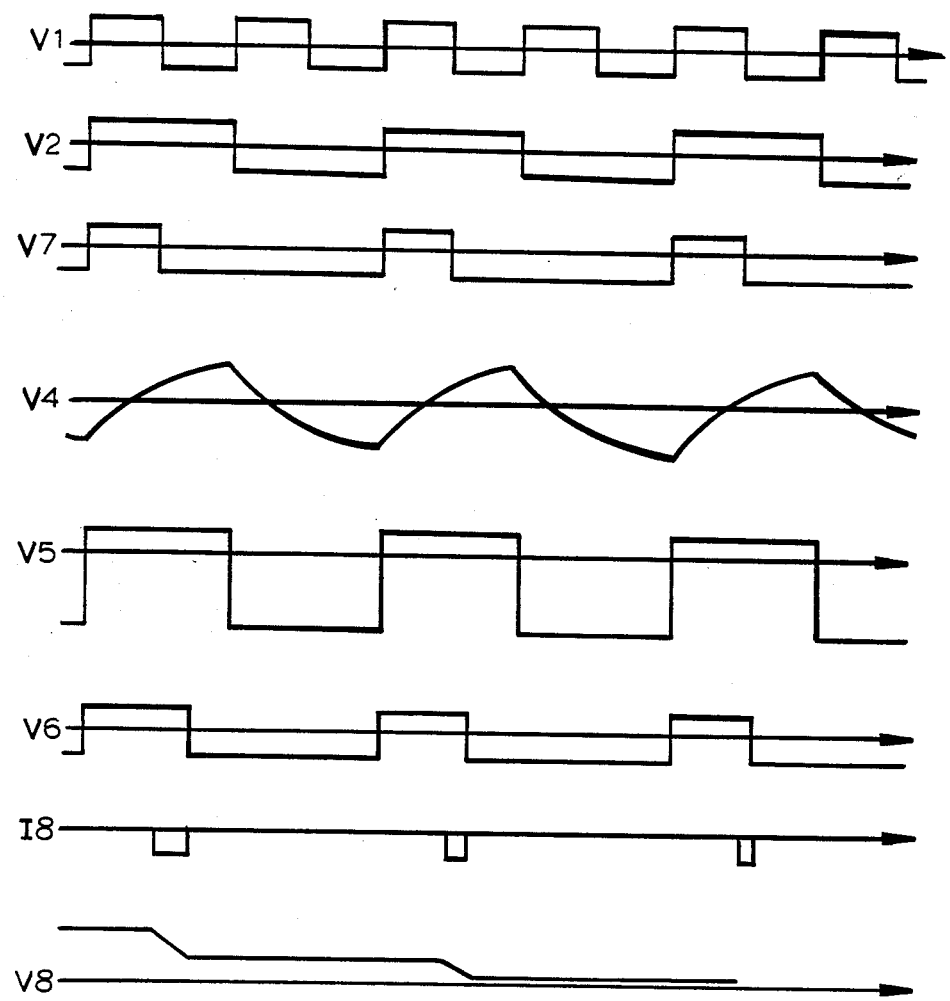
FIG. 2 is a time diagram of the main waveforms.

At the output of amplifier M1, connected to wire 4, a signal is obtained with a behavior similar to that denoted by V4 in FIG. 2. It consists of a sequence of exponentially decreasing and increasing ramps with the time constant of the transfer function of the low-pass network implemented by amplifier M1.

The increasing part of V4 can be expressed by the following relation:

$$V4=Ao(1-2\exp(-GBt)/(1+\exp(-GBT/2))) \qquad (1)$$

where T is the period of V2, equal to twice the control signal period, and t the time. As previously mentioned, time constant is equal to 1/(G*B).

This signal is sent to the inverting input of a threshold comparator, denoted by CA in FIG. 1, while a signal obtained from the sum of the signal present on wire 3 and that supplied by GT is sent to the non-inverting input, connected to wire 5. The amplitudes of these two signals are conveniently adjusted through a resistive divider formed by R1 and R2. A two-level reference signal is thus obtained for the threshold comparator, so as to obtain voltage equality at inputs 4 and 5 only in correspondance with increasing ramps of the signal present on wire 4.

The quite simple value of the ratio betwen G*B and fc, already mentioned, can be obtained by a convenient choice of the ratio between R1 and R2: more particularly, it is possible to demonstrate that this ratio must be equal to 0.479349.

The reference signal is denoted by V5 in FIG. 2, while V6 denotes the signal outgoing from the threshold comparator. This signal presents a leading edge coincident with that of V5 and a trailing edge coincident with the instant at which V4 and V5 have the same amplitude.

Signal V5 presents a higher voltage level given by the following relation:

$$V5 = Ao(R2-R1)/(R2+R1) \qquad (2)$$

As from relations (1) and (2), both V4 and V5 present the same multiplier Ao, representing the value of the voltage generated by GT, that is why its possible variation does not affect the comparison between V4 and V5 amplitudes. In fact Ao appears as a common mode voltage at threshold-comparator differential-inputs.

As shown in FIG. 1, the signal on wire 6 is set to a time comparator circuit CD making the comparison of this time duration with that of the signal supplied by logic circuit LC on wire 7. Namely, circuit CD carries out on input signals an EX-OR operation, by supplying on wire 8 an output current when the duration of the high level portion of V6 (FIG. 2) is lower than that of V7, by drawing an input current in the opposite case and a null current in case of equality. In FIG. 2 this current, denoted by I8, is represented by a negative sign to indicate that it is entering CD.

In FIG. 1 wire 8 outgoing from CD arrives at one of the terminals of a capacitor C, the other terminal being connected to the negative power-supply voltage −Vee. In function of the current supplied by CD the capacitor is charged or discharged, presenting a voltage with a trend similar to that shown in FIG. 2 and denoted by V8. The waveform represents a voltage of decreasing value, since current I8 has a negative value.

The voltage present across capacitor C controls a bias circuit, denoted by CP in FIG. 1, which by varying the currents sent to the operational amplifiers controls their G*B products. More particularly G*B value is inversely proportional to the voltage across C.

An undesired G*B increase causes a reduction in the time constant of integrator M1 and hence a more rapid increase of the voltage ramp at its output. That causes the generation of shorter pulses at output 6 of comparator CA, more particularly shorter that those at output 7 of LC. As a consequence the current generated by CD charges capacitor C and higher voltage at CP input causes a reduction of G*B product, with consequent correction of its value.

Supposing, however that a reduction of G*B product is desired, the signal frequency at input 1 is reduced, thus obtaining a proportionally more rapid increase of the ramp at the output of integrator M1: in fact the response of a low-pass network to a lower-frequency signal is more rapid. Then corrections are carried out as in the preceding case of non-desired G*B increase.

It is clear that what described has been given only by way of a non-limiting example. Variations and modifications are possible without going out of the scope of the present invention.

We claim:

1. A system for automatically controlling a gain-bandwidth product G*B of plurality of operational amplifiers on a common chip, comprising:

a bias circuit having an output connected to all of the operational amplifiers on said chip whose gain-bandwidth products are to be controlled;

a logic circuit having an input receiving a control signal of a frequency fc for presetting said products of said operational amplifiers and a duty cycle of 50%, and first and second outputs respectively delivering a signal of half said frequency fc, and a signal obtained from a logic-AND operation between said control signal and said signal of said first output;

a squaring circuit having an input connected to said first output, a reference voltage input and an output, said output of said squaring circuit supplying a square-wave signal with positive and negative amplitudes equal to that of a reference voltage applied to said reference voltage input;

a reference voltage source connected to said reference voltage input of said squaring circuit for applying said reference voltage thereto;

means for connecting said output of said squaring circuit to a noninverting input of said operational amplifiers connected to present at a very low frequency a pole of a transfer function with a time constant which is a function of a reciprocal of the gain-bandwidth product thereof and also connected in a voltage-follower configuration, said one of said operational amplifiers having an output;

a threshold comparator having an inverting input connected to said output of said one of said operational amplifiers, a noninverting input connected to said output of said squaring circuit through a first resistor and to said source through a second resistor, and an output supplying a signal with leading edges coincident with those of a summation signal appearing at said noninverting input of said threshold comparator and trailing edges coincident in time with points in time at which voltages of the signals at said inverting and said noninverting inputs of the threshold comparator are equal;

a duration comparing circuit having a first input connected to said output of said threshold comparator, a second input connected to said second output of said logic circuit and an output at which is supplied a current signal with an outgoing direction when a high-level part of the signal supplied at said output of said threshold comparator exceeds the signal supplied by said second output of said logic circuit and with an incoming direction when a high-level part of the signal supplied at said output of said threshold comparator is less than the signal supplied by said second output of said logic circuit;

a capacitor having one terminal connected to a negative voltage source and a second terminal connected to said output of said duration comparing circuit for developing a control voltage across said capacitor as a function of said current signal; and means for applying said control voltage to said bias circuit so as to vary the gain-bandwidth products of said operational amplifier inversely with the control voltage across said terminals.

2. The system defined in claim 1 wherein said gain-bandwidth product is equal to the frequency fc divided by D and the ratio between resistances of said first and second resistors is 0.479349.

* * * * *